(12) United States Patent
Zhu et al.

(10) Patent No.: US 7,473,112 B2
(45) Date of Patent: Jan. 6, 2009

(54) FLASH MEMORY DEVICE WITH ELASTIC MEMBER

(75) Inventors: Zhi-Wen Zhu, Kunshan (CN); Guo-Hua Zhang, Kunshan (CN); Jin-Kui Hu, Kunshan (CN); De-Wen Xia, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/825,860

(22) Filed: Jul. 9, 2007

(65) Prior Publication Data
US 2008/0019090 A1 Jan. 24, 2008

(30) Foreign Application Priority Data
Jul. 7, 2006 (CN) ............... 2006 2 0074675 U
Jul. 11, 2006 (CN) ............... 2006 2 0074877 U
Jul. 18, 2006 (CN) ............... 2006 2 0075223 U

(51) Int. Cl.
H01R 13/44 (2006.01)
(52) U.S. Cl. ..................................... 439/142
(58) Field of Classification Search ............. 439/142, 439/143, 144, 147, 136
See application file for complete search history.

(56) References Cited

U.S. PATENT DOCUMENTS

| 6,193,522 | B1* | 2/2001 | Liao ........................ 439/31 |
| 6,926,544 | B2 | 8/2005 | Lee |
| 6,932,629 | B2 | 8/2005 | Ikenoue |
| 7,241,153 | B2* | 7/2007 | He et al. ................ 439/148 |
| 2005/0130469 | A1* | 6/2005 | Ikenoue ................... 439/131 |
| 2007/0063249 | A1* | 3/2007 | Rambosek et al. ........ 257/315 |
| 2008/0026514 | A1* | 1/2008 | Nakagawa ............... 438/172 |
| 2008/0094807 | A1* | 4/2008 | Hiew et al. .............. 361/737 |
| 2008/0146295 | A1* | 6/2008 | Jorgensen et al. ...... 455/575.3 |

\* cited by examiner

Primary Examiner—Neil Abram
Assistant Examiner—Phuong Nguyen
(74) Attorney, Agent, or Firm—Wei Te Chung

(57) ABSTRACT

A flash memory device includes a main body, a cover and an elastic member connecting the main body and the cover. The main body includes a hinge protrusion formed thereon. The cover includes a tail and a pair of parallel plates facing each other and spaced by an interval corresponding to a thickness of the main body. At least one plate defines an opening for receiving the hinge protrusion so that the cover is rotatable with respect to the main body. The elastic member is fastened to the cover to abut against the protrusion, or fastened to the main body to abut against the cover, when the cover is rotatable relative to the main body.

20 Claims, 14 Drawing Sheets

FLASH MEMORY DEVICE WITH ELASTIC MEMBER

BACKGROUND OF THE INVENTION

1. Field of the Invention

The present invention relates to a personal computer peripheral device, and more particularly to a flash memory device with rotary cover.

2. Description of the Prior Art

With the fast development of the electrical domain, flash memory is currently used in variety of apparatus including digital cellular phone, digital camera, PC card, and digital setup box or inner controller for notebook computer. In the meantime, a USB interface plays a role of plug and play between a computer and a flash memory device. The computer could read data stored in the flash memory device through such USB interface or could record necessary data on the flash memory device.

U.S. Pat. No. 6,926,544 B2 discloses a conventional flash memory device which comprises a main body with a USB interface projecting from a front end of the main body, and a cover rotatable relative to the main body. The main body comprises a pair of hinge protuberances on opposite surfaces thereof. The cover comprises a pair of parallel plate members defining a pair of hinge holes for receiving the hinge protuberances, so that the cover can be rotatable around the hinge protuberances with respect to the main body, whereby the USB interface is either received in an inner space of the cover or rotated for exposuring to the outside of the cover. However, it is understandable that the main body and the cover might become loose after long-time friction between the hinge protuberances and the hinge holes. As a result, relative rotary movement easily occurs between the main body and the cover, thereby the USB interface is easily to be exposed outside from the cover although the USB interface is not need to be used. In this condition, alien substances can penetrate into the exposed USB interface which can't be protected by the cover any more, therefore the USB interface might be damaged.

Hence, an improved flash memory device is needed to solve the problem above.

BRIEF SUMMARY OF THE INVENTION

A main object of the present invention is to provide a flash memory device with a stable structure which can prevent looseness between a main body and a rotatable cover with respect to the main body.

In order to attain the object above, a flash memory device includes a main body and a cover rotatable with respect to the main body. The main body comprises a printed circuit board (PCB) mounted therein and an interface protruding from a distal end of the main body. The interface electrically connects with the PCB. The main body comprises a hinge protrusion formed on at least one side thereof. The cover includes a tail and a pair of parallel plates extending from opposite ends of the tail. The pair of parallel plates face each other and are spaced by an interval corresponding to a thickness of the main body. At least one plate defines an opening to receive the hinge protrusion so that the cover is rotatable with respect to the main body. In order to prevent looseness between the main body and the cover, an elastic member is firmly attached to the cover to abut against the hinge protrusion when the cover pivots relative to the main body. In other ways, the elastic member can be fastened to the main body to abut against the cover when the cover rotatable relative to the main body. The elastic member is used to connect the cover and the main body to prevent looseness between the cover and the main body.

Other objects, advantages and novel features of the invention will become more apparent from the following detailed description of the present embodiment when taken in conjunction with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF EMBODIMENTS

Figure 1:
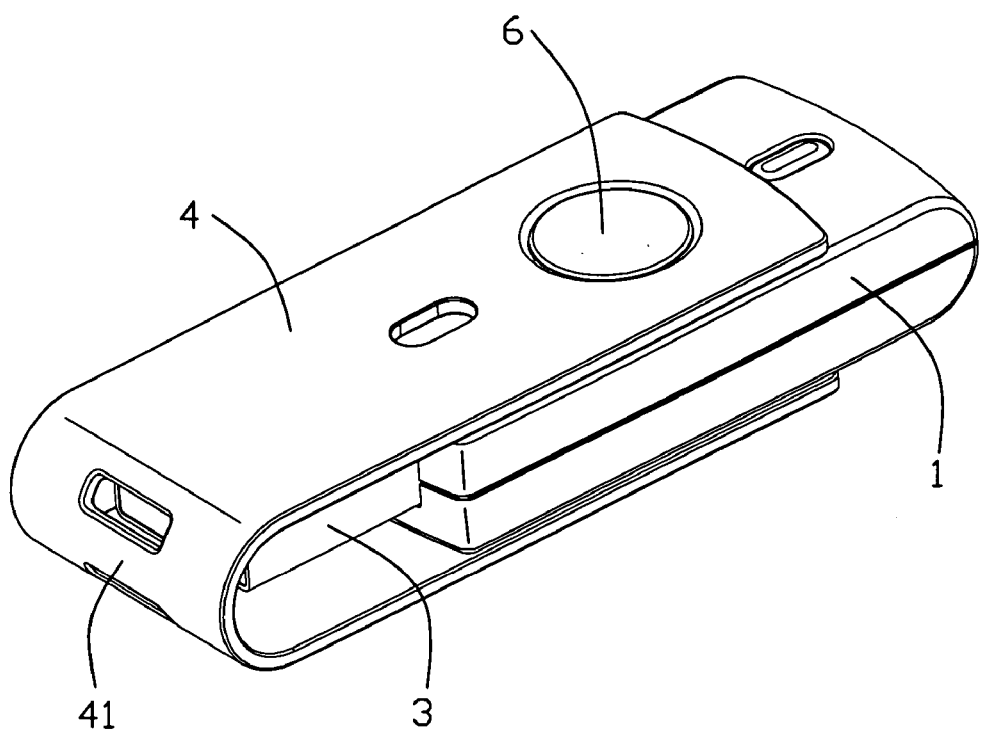
FIG. 1 is a perspective view of a flash memory device according to a first embodiment of the present invention.

Reference will now be made to the drawing figures to describe the embodiments of the present invention in detail. In the following description, the same drawing reference numerals are used for the same elements in different drawings.

Figure 2:
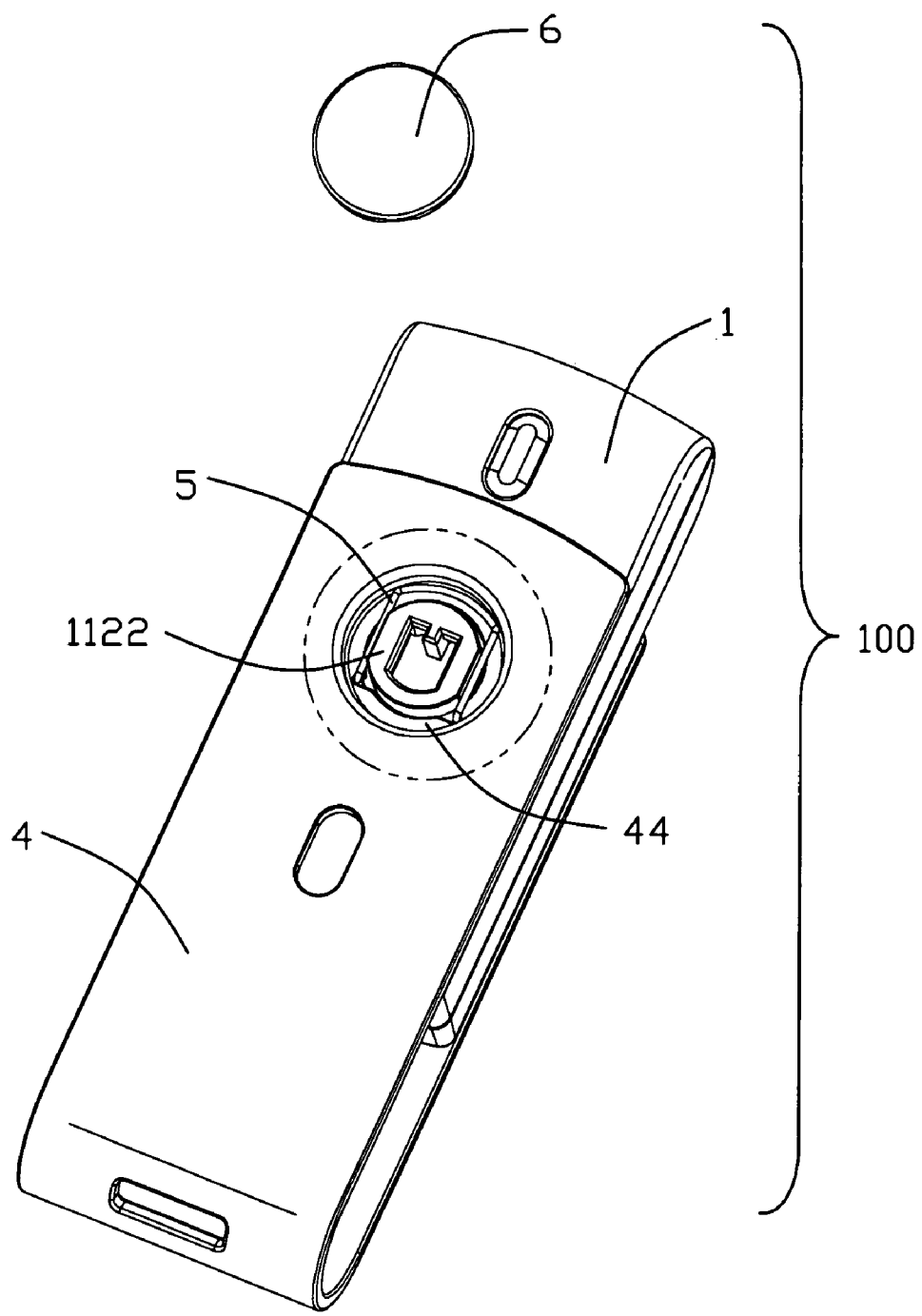
FIG. 2 is a perspective view of the flash memory device with a holding block detached therefrom.
Figure 3:
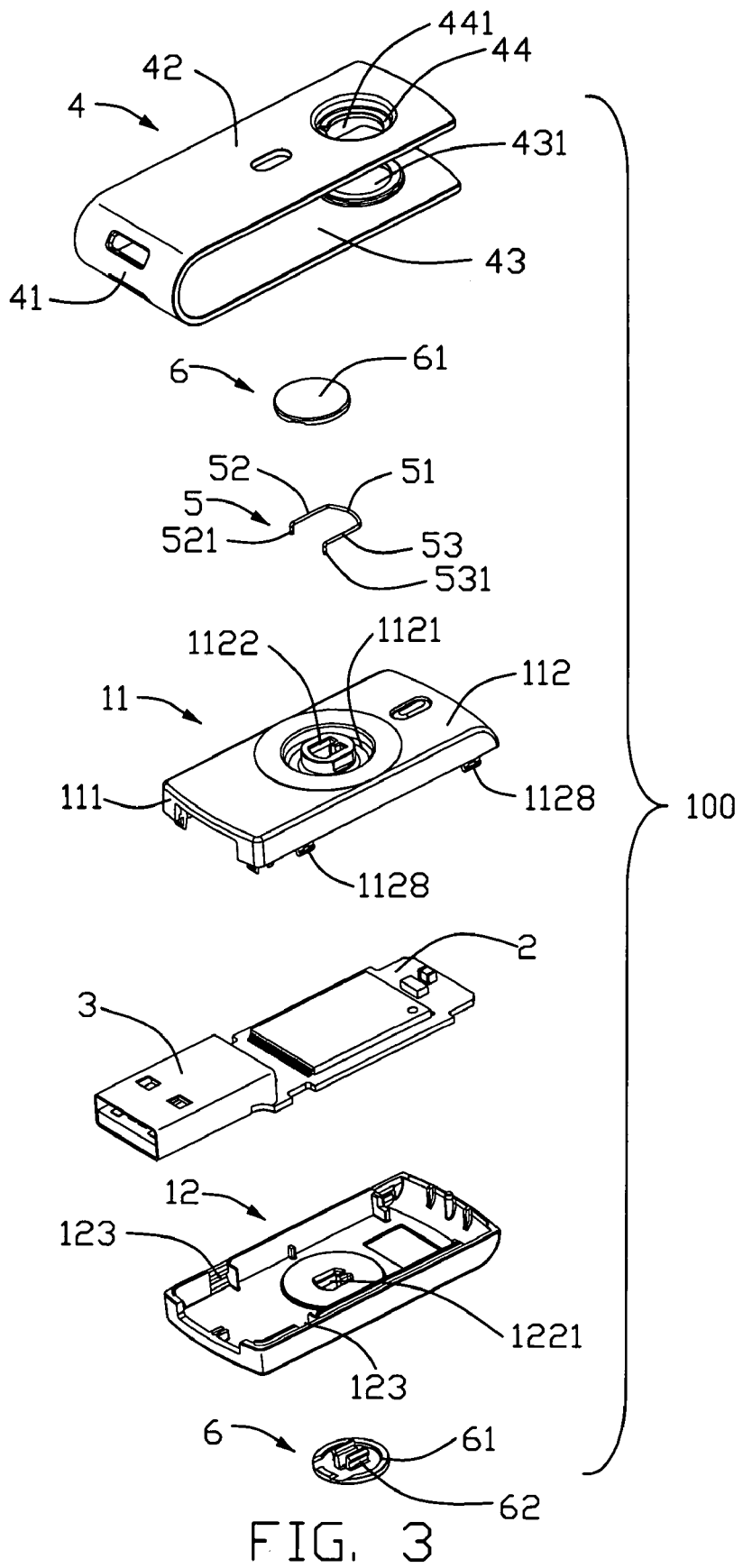
FIG. 3 is an exploded view of the flash memory device of the first embodiment of the present invention.
Figure 4:
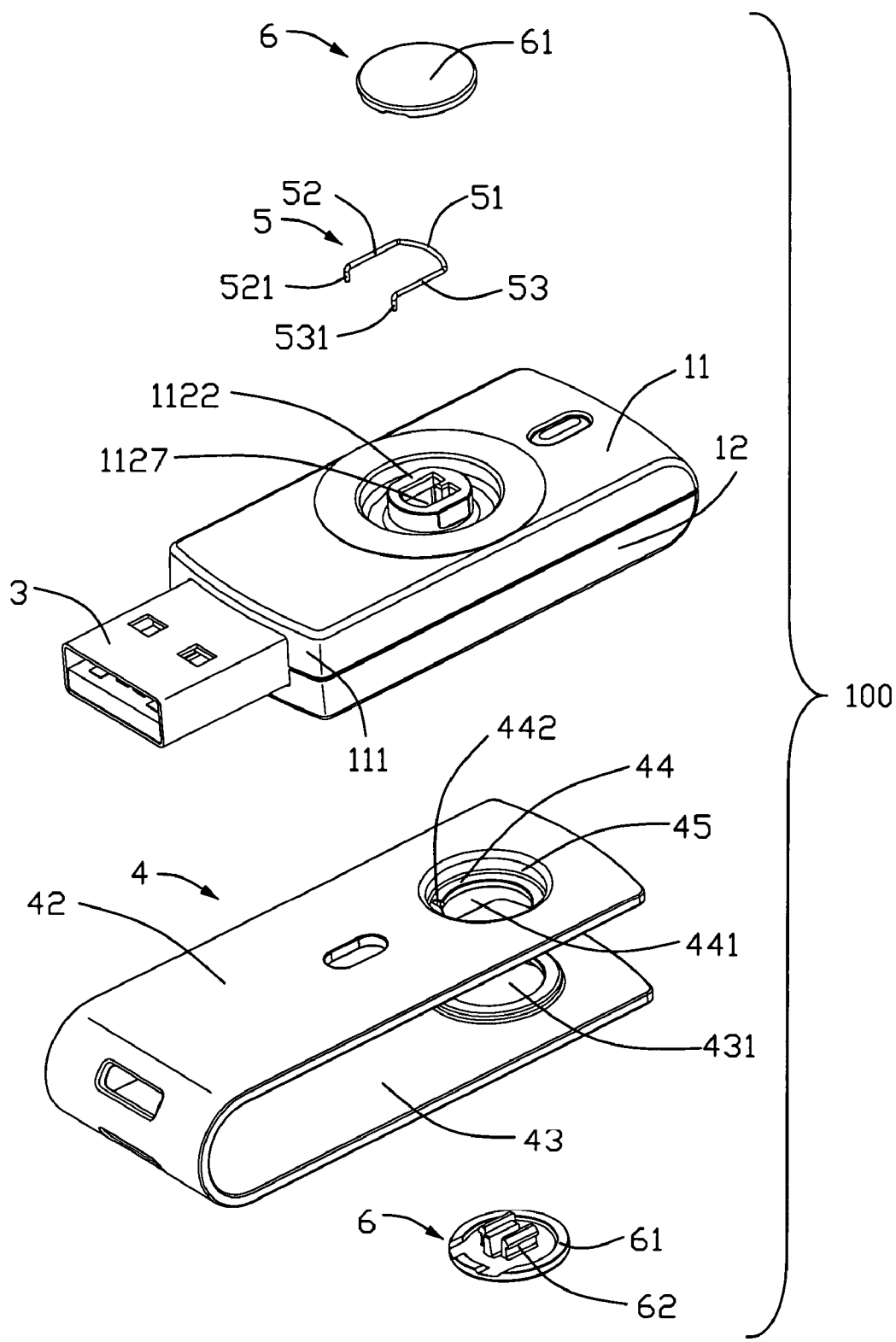
FIG. 4 is a partially assembled view of the flash memory device.
Figure 5:
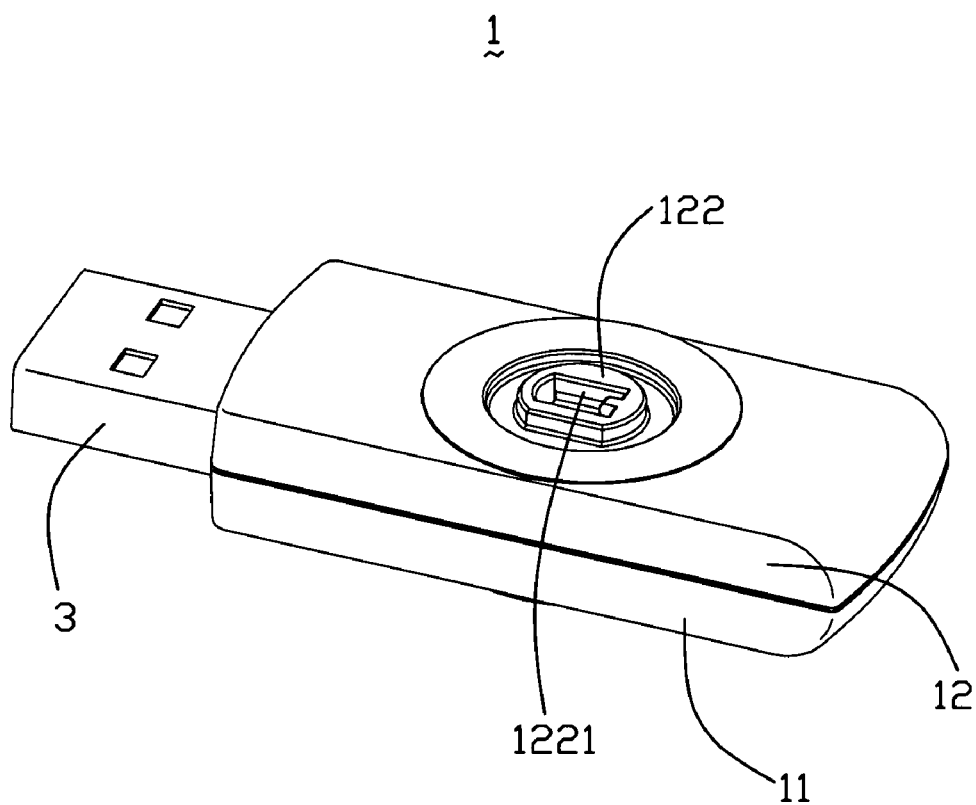
FIG. 5 is a perspective view of a main body shown in FIG. 4, but viewed from another aspect.

Referring to FIGS. 1-5, a flash memory device 100, which can be used for data transmission with a personal computer according to a first embodiment of the present invention, includes a main body 1 and a cover 4 rotatable with respect to the main body 1. The main body 1 comprises a printed circuit board (PCB) 2 mounted therein and an interface 3 protruding from a distal end 111 of the main body 1 as shown in FIGS. 3-4. The interface 3 in the first embodiment is a standard Universal Serial Bus (USB) plug port which electrically connects with the PCB 2. Besides, in order to prevent looseness between the main body 1 and the cover 4, an elastic member 5 is firmly attached to the cover 4 as shown in FIG. 2, which will be detailed hereinafter.

Please refer to FIG. 3, the main body 1 is substantially rectangular shaped and further comprises a first shell 11 and a second shell 12 fixed to the first shell 11 with the PCB 2 mounted therebetween. The first shell 11 comprises a first round groove 1121 recessed on a top surface 112 thereof and a first hinge protrusion 1122 upwardly disposed in the first round groove 1121, wherein a top face of the first hinge protrusion 1122 is a little lower than the top surface 112. Further referring to FIG. 6, the first hinge protrusion 1122 comprises a pair of opposite first and second parallel mating walls 1123, 1124, a pair of curved walls 1125, 1126 connecting the mating walls 1123, 1124, and a first mounting hole 1127 extending through the first hinge protrusion 1122. The second shell 12 is similar to the first shell 11 and comprises a second hinge protrusion 122 (shown in FIG. 5) corresponding to the first hinge protrusion 1122. The second hinge protrusion 122 defines a second through hole 1221 extending therethrough corresponding to the first mounting hole 1127. The first shell 11 further comprises a plurality of hooks 1128 and the second shell 12 defines a plurality of mating apertures 123 for abutting against the hooks 1128, so that the first and second shells 11, 12 can be fastened together.

The cover 4 is stamped and bended from a metal sheet. The cover 4 is U-shaped, when viewed laterally and comprises a tail 41 and a pair of first and second parallel plates 42, 43 extending from opposite ends of the tail 41. The first and second parallel plates 42, 43 face each other with an interval corresponding to the thickness of the main body 1. The first plate 42 is stamped to form a first mating depression 45 and an entitative mating face 44 on bottom of the first mating depression 45. The mating face 44 defines a first round opening 441 in a center thereof and a pair of engaging holes 442 in communication with the first opening 441. The second plate 43 defines a second round opening 431 under the corresponding first round opening 441 for receiving the second hinge protrusion 122.

Figure 6:
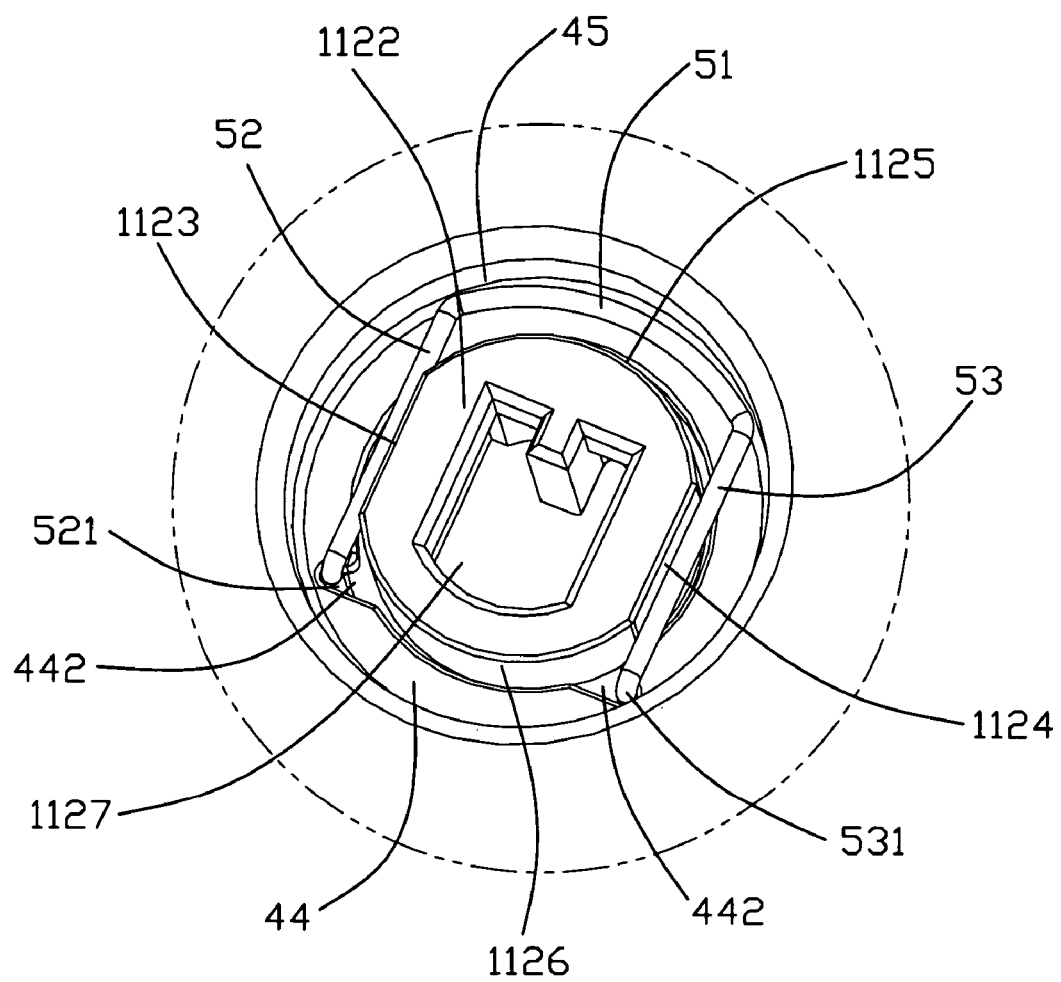
FIG. 6 is a partly enlarged view taken from the circle of FIG. 2.
Figure 7:
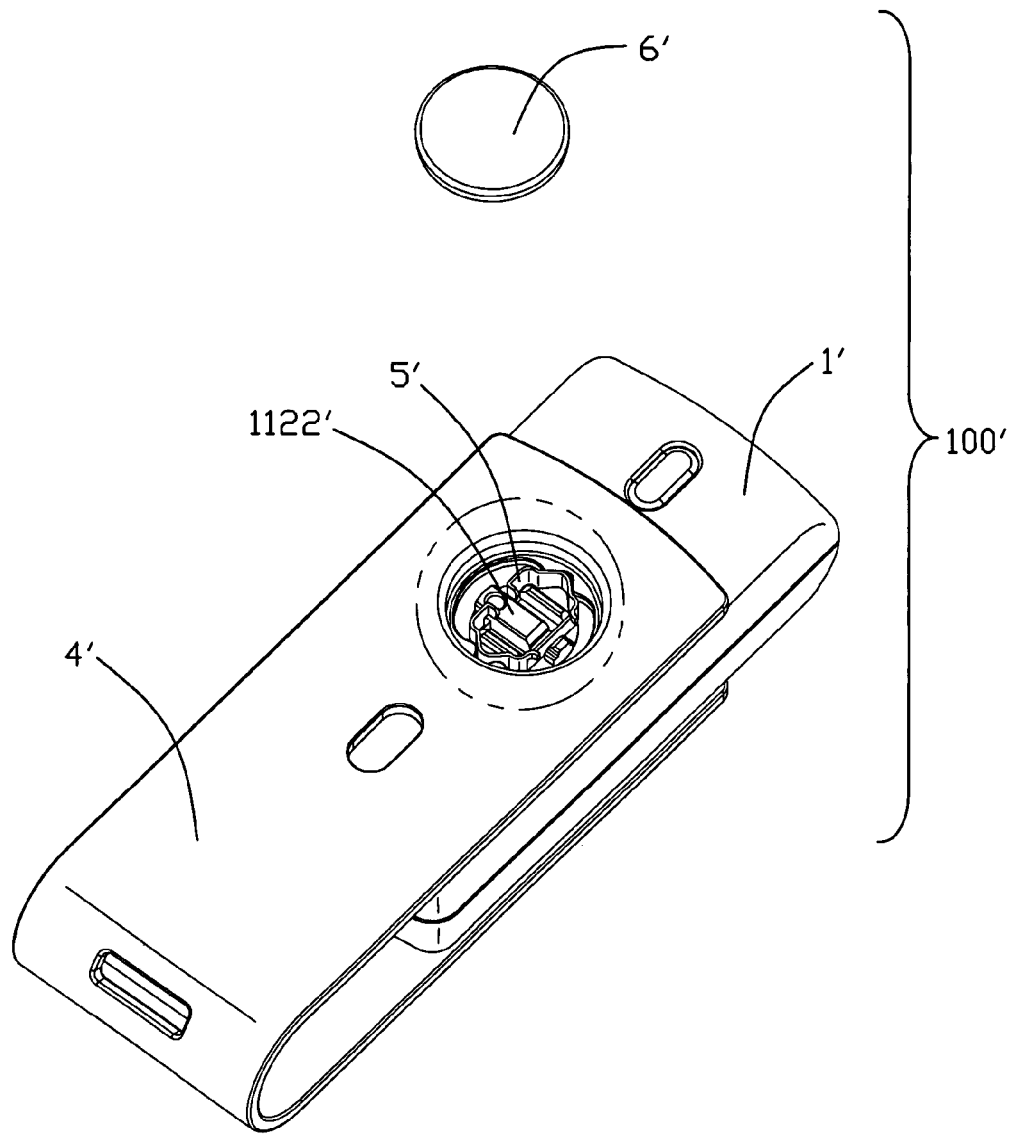
FIG. 7 is a perspective view of a flash memory device with a holding block detached therefrom according to a second embodiment of the present invention.
Figure 8:
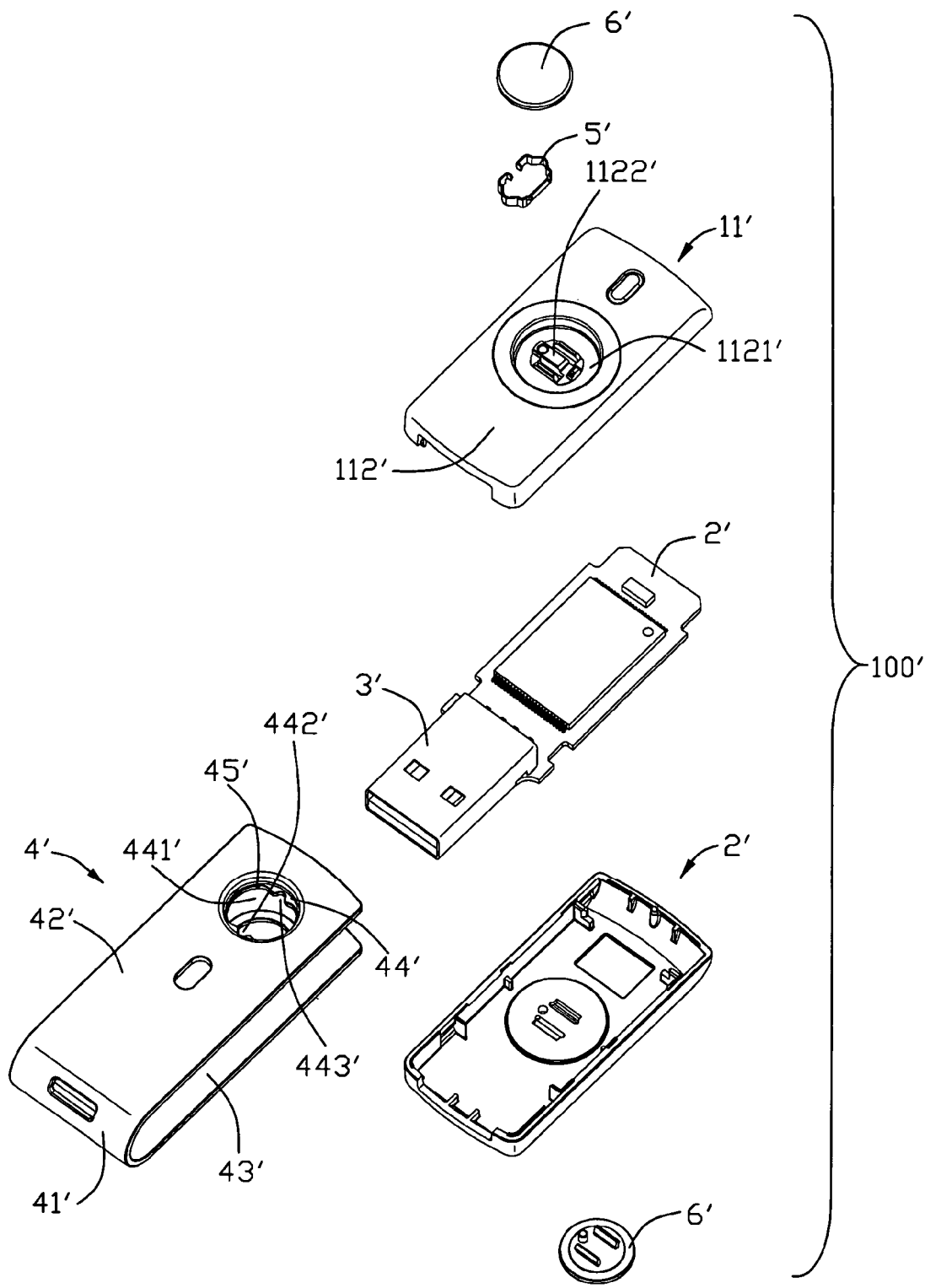
FIG. 8 is an exploded view of the flash memory device of the second embodiment.
Figure 9:
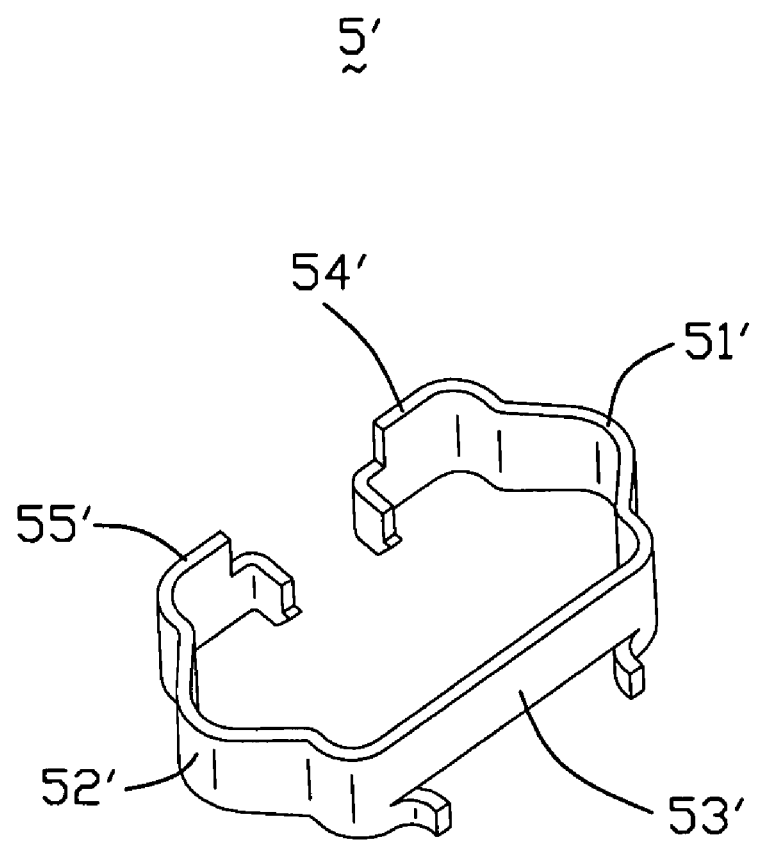
FIG. 9 is a perspective view of an elastic member shown in FIG. 8, but viewed from another aspect.
Figure 10:
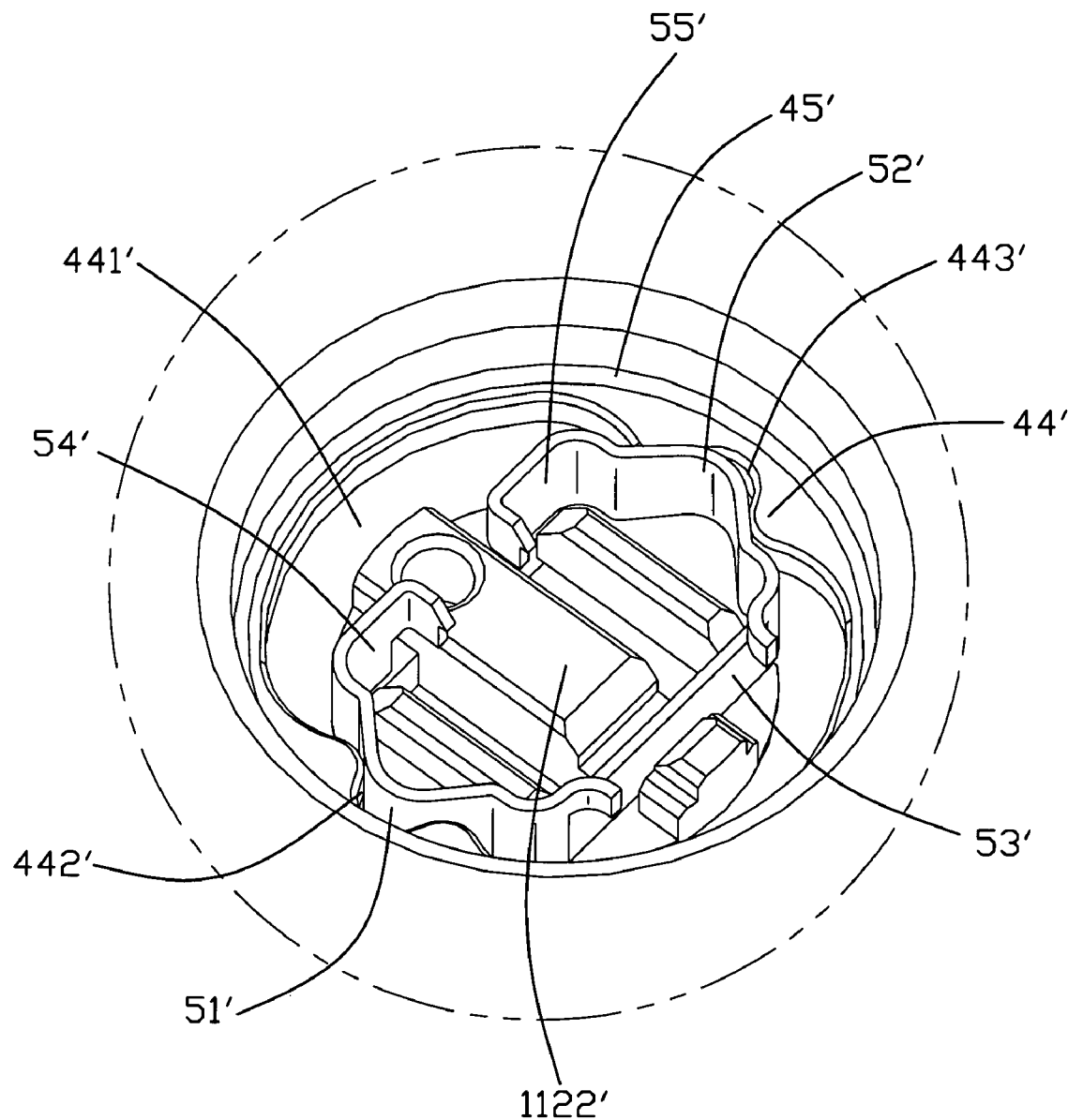
FIG. 10 is a partly enlarged view taken from the circle of FIG. 7.
Figure 11:
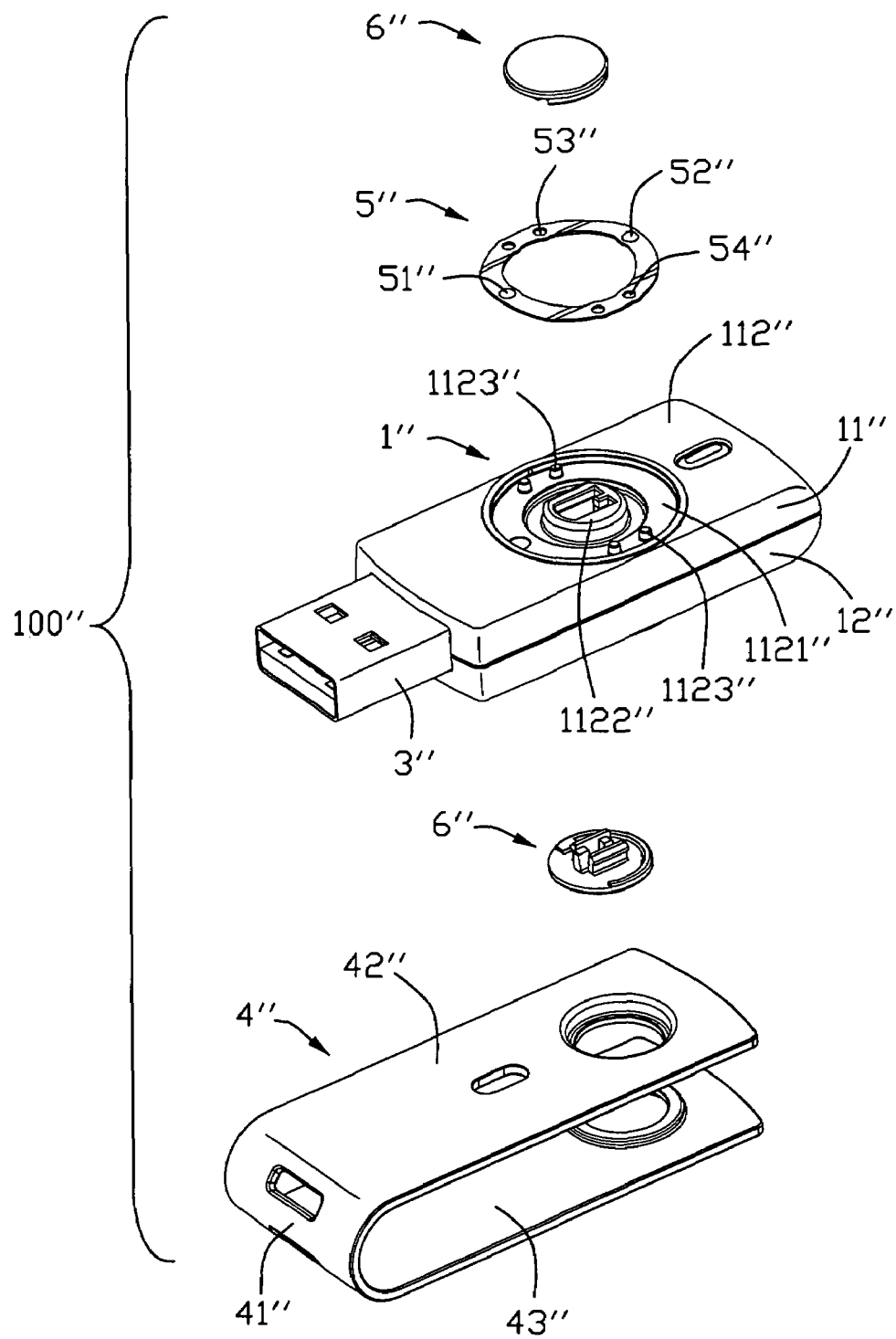
FIG. 11 is an exploded view of a flash memory device according to a third embodiment of the present invention.
Figure 12:
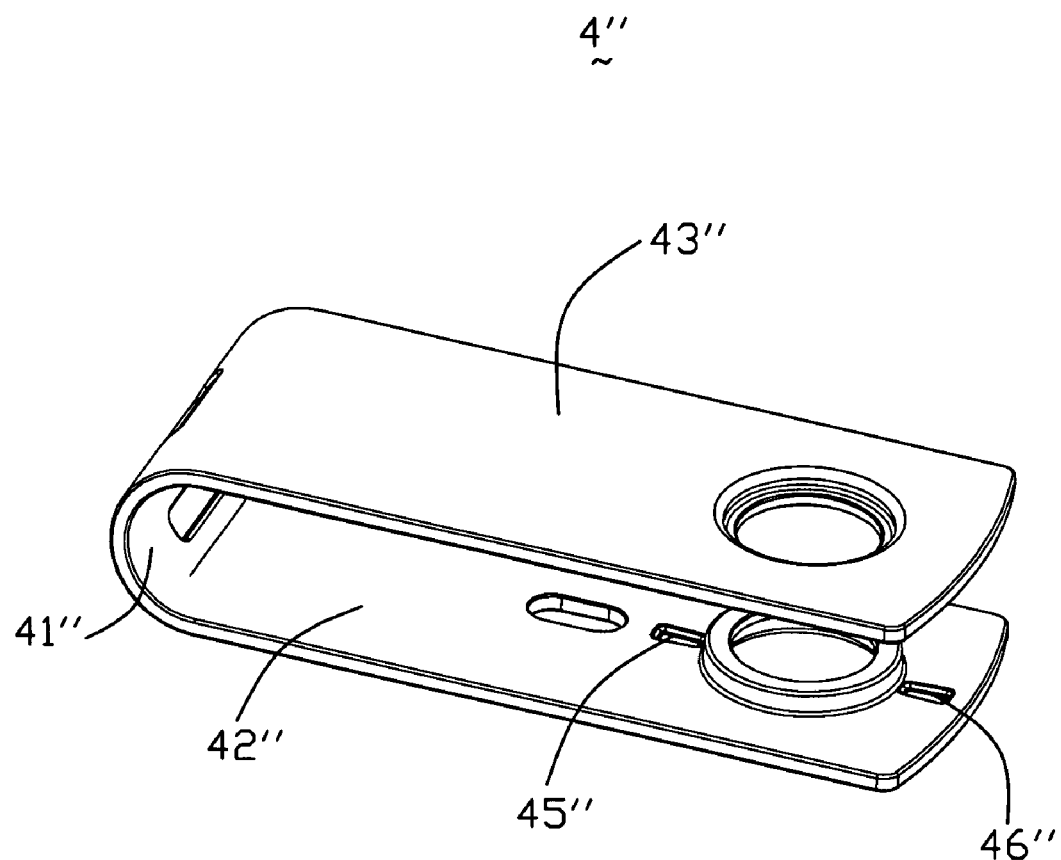
FIG. 12 is a perspective view of a cover shown in FIG. 11.
Figure 13:
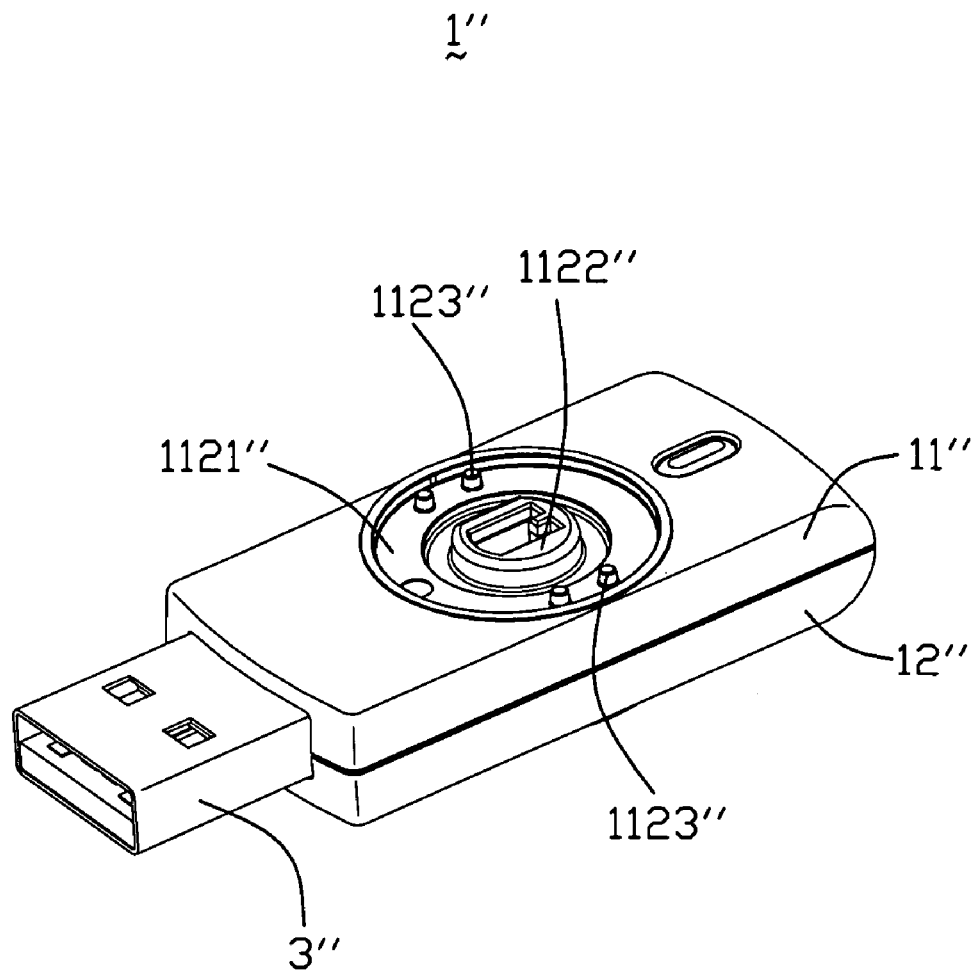
FIG. 13 is a partially assembled view of the flash memory device shown in FIG. 10.
Figure 14:
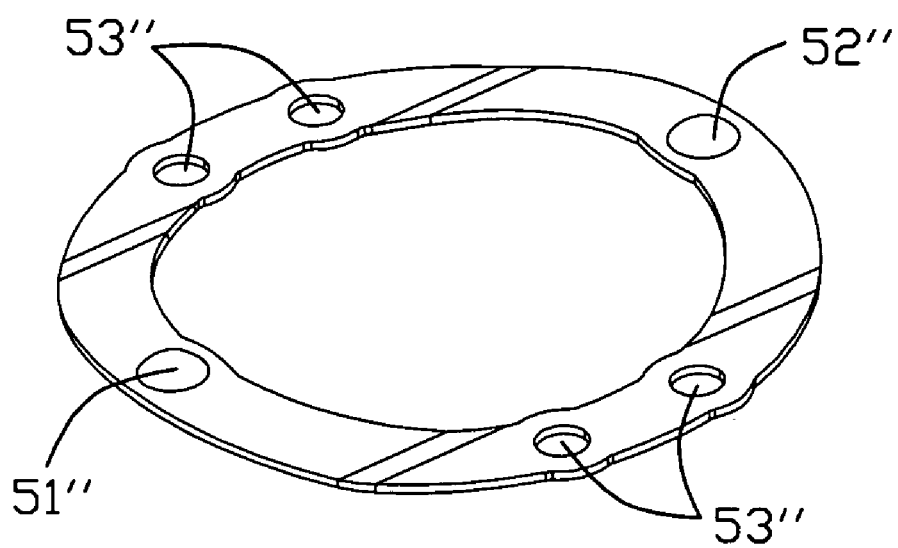
FIG. 14 is a perspective view of an elastic member shown in FIG. 11.

Referring to FIGS. 4 and 6, the metal elastic member 5 is substantially U-shaped and comprises a curved rear portion 51 and a pair of first and second arms 52, 53 extending from the rear portion 51. The first and second arms 52, 53 comprise a first and a second hook portion 521, 531, respectively for abutting against the first hinge protrusion 1122.

The flash memory device 100 further comprises a pair of holding blocks 6 adapted for mating with corresponding first and second mounting holes 1127, 1221. The pair of holding blocks 6 are of the same configuration wherein each of which comprises a round base 61 and a pair of retaining arms 62 for abutting against the first and second mounting holes 1127, 1221. One of the holding block 6 is fastened to the first mounting hole 1127 of the first shell 11 so that the round base 61 can prevent the elastic member 5 dropping from the main body 1. Since the top face of the first hinge protrusion 1122 is a little lower than the top surface 112 of the first shell 11, when the holding block 6 is attached to the first shell 11, the out surface of the round base 61 is coplanar with the top surface 112.

Referring to FIGS. 1-6, in assembly, the PCB 2 and the interface 3 are retained to the second shell 12. The first shell 11 is fastened to the second shell 12 so that the main body 1 is assembled. The interface 3 protrudes beyond the distal end 111 of the main body 1. The cover 4 is attached to the main body 1 wherein the mating face 44 is received in the first round groove 1121. The first hinge protrusion 1122 upwardly extends through the first opening 441. In the meanwhile, the second hinge protrusion 122 is received in the second opening 431. The elastic member 5 is clipped around the first hinge protrusion 1122 and positioned in the first round groove 1121 wherein the first and second hook portions 521, 531 are fixedly received in the engaging holes 442 so that the elastic member 5 can move together with the cover 4. Besides, the first and second arms 52, 53 abut against the first and second mating walls 1123, 1124, respectively through their intrinsic elastic force (as shown in FIG. 6). The lateral sides of the curved rear portion 51 abut against the first round groove 1121 so that the elastic member 5 can be stable received in the first round groove 1121. Since the elastic member 5 is fixed to the cover 4 and abuts against the first hinge protrusion 1122 of the main body 1, the main body 1 and the cover 4 tightly mate with each other to prevent the interface 3 from being exposed accidentally. The retaining arms 62 of the pair of holding blocks 6 are abutting against corresponding first and second mounting holes 1127, 1221. The holding block 6 attached to the first shell 11 presses the elastic member 5 to prevent it from dropping out of the main body 1. In this condition, the interface 3 is hidden in the cover 4 for protection and the cover 4 can't be easily rotated with respect to the main body 1.

When it is intended to use the flash memory device 100 in storage within the cover 4, a user holds the cover 4 and rotates the main body 1 relative to the cover 4. Since the first and second hook portions 521, 531 of the elastic member 5 are fixedly received in the engaging holes 442 and the lateral sides of the curved rear portion 51 abut against the first round groove 1121, the elastic member 5 can be stable received in the first round groove 1121 and there is substantially no relative rotatable movement between the elastic member 5 and the cover 4. However, the first hinge protrusion 1122 can be rotatable with respect to the elastic member 5 under out forces of the user. In the process, the curved walls 1125, 1126 abut against the first and second arms 52, 53 to cause elastic deformation of the first and second arms 52, 53. In this condition, the cover 4 rotates smoothly relative to the main body 1 and the interface 3 is exposed step by step. In the first embodiment, when the first hinge protrusion 1122 rotates one hundred eighty degrees with respect to the elastic member 5, the first and second arms 52, 53 abut against the second and first mating walls 1123, 1124, respectively to reach another restriction position. In this restriction position, the interface 3 is wholly exposed and the cover 4 can't be rotatable relative to the main body 1 without out forces. It is to be understood that the first hinge protrusion 1122 can be covered with lubricant in order to decrease friction between the first hinge protrusion 1122 and the elastic member 5.

Please refer to FIGS. 7-10, a second embodiment is provided of the present invention. A flash memory device 100' is similar to the flash memory device 100 of the first embodiment. The flash memory device 100' comprises a main body 1', a cover 4' rotatable relative to the main body 1' and an elastic member 5' fixed to the main body 1' to abut against the cover 4'. The main body 1' comprises a first shell 11', a second shell 12' fastened to the first shell 11', a PCB 2' retained between the first and second shells 11', 12', and a USB interface 3' protruding from the main body 1' and electrically connecting with the PCB 2'. The first shell 11' comprises a first round groove 1121' recessed on a top surface 112' thereof and a first hinge protrusion 1122' upwardly disposed in the first round groove 1121'.

The cover 4' is similar to the cover 4 of the first embodiment and comprises a tail 41' and a pair of first and second parallel plates 42', 43' extending from opposite ends of the tail 41'. The first and second parallel plates 42', 43' face each other with an interval corresponding to the thickness of the main body 1'. The first plate 42' is stamped to form a first mating depression 45' and an entitative mating face 44' on bottom of the first mating depression 45'. The mating face 44' defines a first opening 441' in a center thereof and a pair of first and second engaging holes 442', 443' in communication with the first opening 441'. The first and second engaging holes 442', 443' are recessed along opposite directions and face each other.

The elastic member 5' is made of metal material and comprises a pair of first and second mating protrusions 51', 52', a retaining portion 53' connecting first ends of the first and second mating protrusions 51', 52' and L-shaped distal ends 54', 55' respectively extending from second ends of the first and second mating protrusions 51', 52'. The first and second mating protrusions 51', 52' are respectively received in the first and second engaging holes 442', 443' in order that the cover 4' can't be rotatable with respect to the main body 1' accidentally. In this condition, the interface 3' is hidden in the cover 4' for protection.

When in use, a user can hold the cover 4' and rotate the main body 1' relative to the cover 4' to expose the interface 3'. Since the elastic member 5' is stably fixed to the first hinge protrusion 1122' of the main body 1', there is substantially no relative rotatable movement between the elastic member 5' and the main body 1'. However, the cover 4' can be rotatable with respect to the elastic member 5' and the main body 1' under out forces of the user. In the process, the first and second mating protrusions 51', 52' abut against corresponding first and second engaging holes 442', 443' to leave the first and second engaging holes 442', 443' simultaneously so that the cover 4' can easily rotate relative to the main body 1' to expose the interface 3'. In the second embodiment, when the cover 4' rotates one hundred eighty degrees with respect to the main body 1', the first and second mating protrusions 51', 52' abut against the second and first engaging holes 443', 442' and then are received in the second and first engaging holes 443', 442', respectively, to provide another restriction position. As a result, the interface 3' is wholly exposed and the cover 4' can't be rotatable relative to the main body 1' without out forces. In the second embodiment, the elastic member 5' is fixed to the main body 1' and abuts against the cover 4' so that the cover 4' can't be rotatable with respect to the main body 1' to expose the interface 3' accidentally, thereby protecting the interface 3' from being damaged. The flash memory device 100' further comprises a holding block 6' attached to the first hinge protrusion 1122' to press the elastic member 5' and prevent it from dropping out of the main body 1'.

Please refer to FIGS. 11-14, a third embodiment is provided of the present invention. A flash memory device 100" is similar to the flash memory device 100' of the second embodiment. The flash memory device 100" comprises a main body 1", a cover 4" rotatable relative to the main body 1" and an elastic member 5" fixed to the main body 1' and abutting against the cover 4". The main body 1" comprises a first shell 11", a second shell 12" fastened to the first shell 11" and a USB interface 3" protruding from the main body 1". The first shell 11" comprises a first round groove 1121" recessed on a top surface 112" thereof, a first hinge protrusion 1122" upwardly disposed in the first round groove 1121", and two pairs of projecting posts 1123" disposed beside the first hinge protrusion 1122".

The cover 4" is similar to the cover 4 of the first embodiment and comprises a tail 41" and a pair of first and second parallel plates 42", 43" extending from opposite ends of the tail 41". The first and second parallel plates 42", 43" face each other with an interval corresponding to the thickness of the main body 1". The first plate 42" is stamped to form a pair of first and second engaging holes 45", 46" for mating with the elastic member 5".

The elastic member 5" is ring-shaped and made of metal material. The elastic member 5" defines two pairs of mounting holes 53", 54" to be fixed to the projecting posts 1123" so that the elastic member 5" can be stably fastened to the main body 1". The elastic member 5" further comprises a pair of first and second mating protrusions 51", 52" for mating with the first and second engaging holes 45", 46". The first and second mating protrusions 51", 52" are calotte-shaped and are received in the corresponding first and second engaging holes 45", 46", respectively, in order that the cover 4" can't be rotatable with respect to the main body 1" accidentally. In this condition, the interface 3" is hidden in the cover 4" for protection.

It is easy to be understood that a user can hold the cover 4' and rotate the main body 1' relative to the cover 4' to expose the interface 3'. Since the elastic member 5' is stably fixed to the main body 1', there is no relative rotatable movement between the elastic member 5' and the main body 1'. However, the cover 4' can be rotatable with respect to the elastic member 5' and the main body 1' under out forces of the user. In the process, the first and second mating protrusions 51', 52' abut against corresponding first and second engaging holes 45", 46" to leave the first and second engaging holes 45", 46" so that the cover 4' can easily rotate relative to the main body 1' to expose the interface 3'. In the third embodiment, when the cover 4' rotates one hundred eighty degrees with respect to the main body 1', the first and second mating protrusions 51', 52' abut against the second and first engaging holes 46", 45" and then are received in the second and first engaging holes 46", 45"', respectively, to provide another restriction position. As a result, the interface 3' is wholly exposed and the cover 4' can't be rotatable relative to the main body 1' without out forces. In the third embodiment, the elastic member 5' is fixed to the main body 1' and abuts against the cover 4' so that the cover 4' can't be rotatable with respect to the main body 1' to expose the interface 3' accidentally, thereby protecting the interface 3' from being damaged. The flash memory device 100' further comprises a holding block 6' attached to the first hinge protrusion 1122' to press the elastic member 5' and prevent it from dropping out of the main body 1'.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A USB rotary flash memory device for data transmission with a personal computer, comprising:
   a main body comprising a hinge protrusion formed on at least one side of the main body;
   a cover mating with the main body and comprising a tail and a pair of parallel plates extending from opposite ends of the tail, the pair of parallel plates facing each other and spaced by an interval corresponding to a thickness of the main body, at least one plate defining an opening to receive the hinge protrusion so that the cover is rotatable with respect to the main body; and
   an individual elastic member fastened to the cover and abutting against around the hinge protrusion when the cover pivots along a narrow side of the body relative to the main body;
   a printed circuit board mounted in the main body and an USB interface electrically connecting with the printed circuit board, the USB interface protruding from an end of the main body.

2. The USB rotary flash memory device according to claim 1, further comprising a holding block fastened to the hinge protrusion to press the elastic member.

3. The USB rotary flash memory device according to claim 1, further comprising the interface is received in an inner space of the cover or exposed outside the cover.

4. The USB rotary flash memory device according to claim 3, wherein the interface is a standard universal serial bus (USB) plug interface.

5. The USB rotary flash memory device according to claim 1, wherein the elastic member comprises a pair of arms clipping the hinge protrusion.

6. The USB rotary flash memory device according to claim 5, wherein the hinge protrusion comprises a pair of parallel mating walls which are clipped by the pair of arms.

7. The USB rotary flash memory device according to claim 6, wherein the hinge protrusion comprises a pair of opposite curved walls connecting the mating walls, and wherein the curved walls abut against the arms of the elastic member when the cover is rotatable with respect to the main body.

8. The USB rotary flash memory device according to claim 5, wherein the main body defines a groove recessed on an out surface thereof with the hinge protrusion positioned therein, the plate comprising an entitative mating face with the opening defined therein, and wherein the entitative mating face is received in the groove with the hinge protrusion extending through the opening.

9. The USB rotary flash memory device according to claim 8, wherein the mating face defines a pair of engaging holes in communication with the opening, the elastic member comprising a pair of hook portions bending from one end of the arms to be fixed to the pair of engaging holes.

10. The USB rotary flash memory device according to claim 9, wherein the plate comprises a mating depression with the mating face disposed on a bottom edge thereof, the elastic member comprises a rear portion connecting the other end of the arms, and wherein the rear portion abuts against the depression so that the elastic member is fixed in the depression.

11. A USB rotary flash memory device for data transmission with a personal computer:
    a main body;
    a cover mating with the main body and comprising a tail and a pair of parallel plates extending from opposite ends of the tail, the pair of parallel plates facing each other and spaced by an interval corresponding to a thickness of the main body, the cover pivots along a narrow side of the body relative to the main body; at least one plate comprising a pair of first and second engaging holes; and
    an individual elastic member fastened to the main body and abutting against the engaging holes to provide two locking positions where the cover can't be easily rotatable with respect to the main body;
    a printed circuit board mounted in the main body and an USB interface electrically connecting with the printed circuit board, the USB interface protruding from an end of the main body.

12. The USB rotary flash memory device according to claim 11, wherein the elastic member comprises a retaining portion connecting the first and second mating protrusions and wherein the retaining portion is fixed to the main body.

13. The USB rotary flash memory device according to claim 11, wherein the elastic member defines a plurality of mounting holes and the main body comprises a plurality of projecting posts to be received in the mounting holes.

14. The USB rotary flash memory device according to claim 11, wherein the elastic member comprises a pair of opposite mating protrusions, the plate comprising an entitative mating face which defines an opening to receive the elastic member therein, the pair of first and second engaging holes formed in the mating face to abut against the first and mating protrusions of the elastic member.

15. The USB rotary flash memory device according to claim 14, wherein the first and second mating protrusions are projecting into the first and second engaging holes, respectively in a first locking position, and wherein the first and second mating protrusions abut against the entitative mating face to occur elastic deformation and then respectively projecting into the second and first engaging holes in a second locking position.

16. The USB rotary flash memory device according to claim 11, wherein the main body comprises a groove recessed therein and a hinge protrusion disposed in the groove, the plate defining an opening to receiving the hinge protrusion so that the cover is rotatable relative to the main body.

17. The USB rotary flash memory device according to claim 16, wherein the first and second mating portions are a pair of first and second engaging holes formed in an inner surface of the plate and on opposite side of the opening, and wherein the elastic member comprises a pair of first and second protrusions projecting upwardly to mate with the engaging holes.

18. A USB rotary flash memory device for data transmission with a personal computer:
    a main body having a mating opening;
    a cover mating with the main body and comprising a tail and at least one plate extending from opposite ends of the tail; and
    pivotal structures formed on both said main body and said cover, respectively, to have the cover rotatable upon the main body, and including:
    an elastic member formed on one of the main body and the cover, and a relative stiff member formed on the other; wherein
    a rotation trace of said elastic member is incompliant with said stiff member so as to result in deflection of said elastic member, thus forming some relaxed positions for the cover where the cover is more retainable with regard to the main body than other positions;
    a printed circuit board mounted in the main body and an USB interface electrically connecting with the printed circuit board, the USB interface protruding from an end of the main body.

19. The USB rotary flash memory device as claimed in claim 18, wherein said deflection is essentially radial expansion.

20. The USB rotary flash memory device as claimed in claim 18, wherein said tail covers the mating opening when the cover is located in the relaxed position.

* * * * *